United States Patent [19]

Mayer et al.

[11] Patent Number: 4,806,854
[45] Date of Patent: Feb. 21, 1989

[54] CURRENT DRAW AND POWER CONSUMPTION DISPLAY CIRCUIT

[75] Inventors: Hans-Dietrich Mayer, Baltmannsweiler; Klaus Hirrlinger, Esslingen a.N., both of Fed. Rep. of Germany

[73] Assignee: Richard Hirschmann Radiotechnisches Werk, Fed. Rep. of Germany

[21] Appl. No.: 910,462

[22] Filed: Sep. 23, 1986

[30] Foreign Application Priority Data

Sep. 23, 1985 [DE] Fed. Rep. of Germany ....... 3533862

[51] Int. Cl.$^4$ .............................. G01R 19/26
[52] U.S. Cl. ..................... 324/96; 324/120; 324/122
[58] Field of Search ............ 324/96, 133, 122, 115, 324/120, 126; 340/654, 660, 662, 664

[56] References Cited

U.S. PATENT DOCUMENTS

| | | | |
|---|---|---|---|
| 503,589 | 8/1893 | Evershed | 324/126 |
| 2,255,637 | 9/1941 | Wright | 340/654 |
| 3,488,586 | 1/1970 | Watrous et al. | 324/96 |
| 3,524,133 | 8/1970 | Arndt | 324/133 |
| 3,611,339 | 10/1971 | Richey | 324/122 |
| 4,151,464 | 4/1979 | Cooper | 324/103 P |
| 4,401,943 | 8/1983 | Morris | 324/115 |
| 4,502,004 | 2/1985 | Schindler | 324/103 P |
| 4,594,546 | 6/1986 | Greene et al. | 324/122 |

FOREIGN PATENT DOCUMENTS 2848791 11/1978 Fed. Rep. of Germany.
572219 9/1974 Switzerland.

OTHER PUBLICATIONS

Weiss et al; "Novel Test Meter"; Radio & Television News; vol. 47; No. 4; Apr. 1952; p. 42.

Primary Examiner—Ernest F. Karlsen
Attorney, Agent, or Firm—Robert J. Koch

[57] ABSTRACT

A circuit layout for continuous display of power consumption of an electric device includes a light emitting diode actuated by voltage pulses, the frequency whereof corresponds to the current draw of the electric device. It is possible to determine directly whether the instantaneous power consumption of the electric device, in particular a household device, is low or high in case of varying loads as the frequency of the voltage pulses and thus the flashing frequency are below the flicker limit resolvable by the human eye. The power consumption display can be manufactured in a highly cost effective manner and in a compact configuration, so that it may be placed in an electric outlet housing.

10 Claims, 1 Drawing Sheet

CURRENT DRAW AND POWER CONSUMPTION DISPLAY CIRCUIT

BACKGROUND OF THE INVENTION

1. Field of the Invention

The invention relates to a circuit layout for continuously displaying current and/or power consumption by an electrical load.

2. Description of the Related Technology

Measuring Instruments for measuring current intensity in amperes or power in Watts whereby the current or power intake of electrical devices are displayed, even continuously, are known in numerous embodiments. Such instruments are rather expensive, particularly for applications where a simple device indicating a low or high current is required.

Moving-iron instruments, used in the field of motor vehicle accessories capable of displaying the current or power intake of such instruments, are more cost-effective. However, since moving-iron instruments comprise mechanical parts, they are not inexpensive and long lived enough to be suitable for many applications. Furthermore, such instruments have small angular needle deflections of 90° to 100°, which is not linear relative to the power or current to be measured. Consequently, certain display or measuring ranges are highly compressed, which detrimentally affects the accuracy of the display.

In connection with electric household devices, such as for example washing machines, refrigerators, air conditioners, automatic hot plates, heating pads, etc., it is frequently necessary to ascertain the instantaneous current intake or power consumption, where the emphasis is on simple indications of a high or a lesser current flow rather than absolute values. Current or power measuring devices, even inexpensive moving-iron instruments, are too costly for such applications and cannot be made compact enough to be placed into a plug housing.

SUMMARY OF THE INVENTION

In the development of the present invention the use of a light emitting diode with varying brightness as a function of current intake of a device was taken into consideration. It was discovered, however, that an adequately large graduation of the brightness of light emitting diodes to determine whether more or less current is flowing, is not possible, as the brightness sensitivity of the human eye is not linear but logarithmic and because light emitting diodes have rapid light saturation. The subsequent consideration of extending the luminous range of light emitting diodes by pulse width control, yielded only slight improvements of the display. The broadening of the display range by several light emitting diode indicators cascaded by means of analog/digital converters is again not applicable in the present case, as a power indicator of this type would be too expensive and cost-intensive, in a manner similar to the use of digital light emitting diodes or LCD displays.

It is an object of the invention to provide a circuit for continuous display of the current and/or power consumption of devices in particular, electric household devices, whereby simple and cost-effective qualitative display is effected The circuit layout and display device is a compact unit, capable of location in the smallest enclosures, such as electric plug housing. The electrical draw qualitatively displayed corresponds to both current through and power consumed by the electrical device This object is attained, according to the invention, by a light emitting diode, intended for display, actuated by voltage pulses. The frequency of the pulses corresponds to the intensity of the current intake. The frequencies corresponding to expected draw may be located below the flashing frequency resolvable by the human eye.

An adequately resolvable qualitative display of whether an electric device is drawing more or less current at the instant of the observation is obtained in spite of the use of highly cost-effective light emitting diodes. The human eye is much more capable of comparing different flashing frequencies than different brightnesses. The display circuit layout and display according to the invention is highly costeffective and well suited for its intended use.

The circuit layout may be chosen so that a 50 Watt power corresponds to a flashing frequency of 1 Hz and the flashing frequency increases with rising power intakes of up to 1 kW linearly to approximately 20 Hz. Beginning at approximately 20 Hz the human eye no longer resolves the individual flashes of the light emitting diode, but perceives the diode as being continuously lighted. It is also possible to extend the flashing frequency range of 20 Hz, where the human eye is still capable of distinguishing individual flashes, to a larger power range, for example a range of 3 kilowatt.

According to particularly advantageous embodiment of the invention, the flashing frequency in a first display range is below the flashing frequency resolvable by the human eye, and in a second display range above the frequency that may still be resolved by the human eye. Frequently it is desirable to have a more accurate display in the lower range of power intake, while in the upper power range a less accurate display is adequate. The abovedescribed embodiment takes this fact into account. For example, the circuit layout is designed so that in the first display range scans a power range from 0 to 1000 Watt with a flashing frequency variation of 1 to 20 Hz, and that the second display range is adjacent to it and extends from 1 to 3 KW, with the brightness of the light emitting diode increasing in the second range. According to an advantageous embodiment of the invention, in the circuit layout of the invention a voltage is taken off a resistance located in the load circuit, rectified by a rectifier and conducted to a voltage/pulse sequence converter, the output signal whereof actuates the light emitting diode.

It is further advantageous to use a resistance with a lower value not appreciably burdening the load circuit and to provide an amplifier to amplify the voltage taken off. The load circuit should remain essentially unaffected by the actuation of the power display, i.e., the voltage drop due to the resistance inserted for the voltage takeoff should be as small as possible. The describe embodiment takes this consideration into account. As the circuit layout is usually located in a small housing, the loss of power due to the resistance should also remain low, so that the circuit layout does not heat up. The embodiment described satisfies this condition also.

It may be advantageous to locate the entire circuit including the light emitting diode in a compact arrangement such as a plug housing. The plug housing may further comprise a power outlet, so that the entire device for the qualitative display of current or power intake can be mass produced cost effectively and used as a timer inserted into an outlet.

BRIEF DESCRIPTION OF THE DRAWINGS

The invention will be more apparent from the example described below with reference to the drawings. In the drawings.

DETAILED DESCRIPTION OF THE PREFERRED EMBODIMENT

Figure 1:
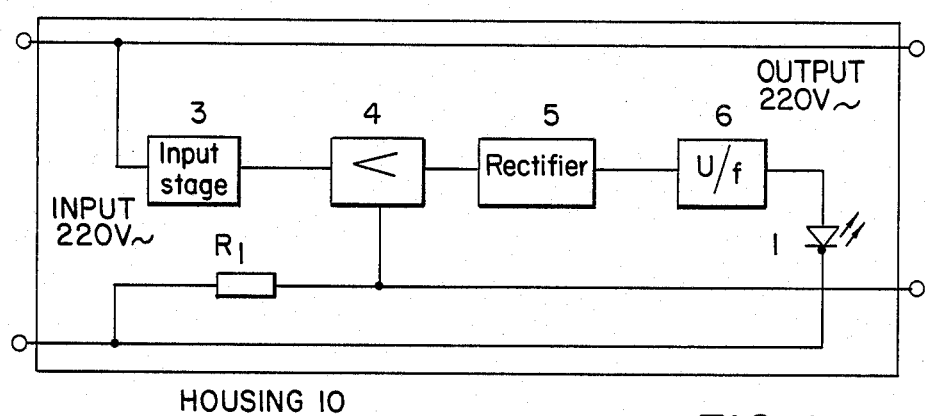
FIG. 1 shows a schematic diagram of a circuit according to the invention.

In the embodiment shown in FIG. 1, an AC network voltage of 220 Volt is applied to the input. One of the input terminals is directly connected to an output terminal. A resistance $R_1$ is located between the second input and output terminals. The resistance $R_1$, is preferably small enough so that the drop in voltage is practically negligible for the load circuit. The circuit embodiment of FIG. 1 may be arranged in a housing 10.

The voltage or drop at resistance $R_1$ is conducted to an amplifier 4, fed by an input stage or part 3 of the network. The output signal of the amplifier is rectified by rectifier 5. The DC voltage at the rectifier output is converted by a circuit stage 6 into a pulse sequence with a frequency proportional to the input voltage The pulse sequence actuates a light emitting diode 1. The LED cathode is connected to the other network voltage input. The voltage taken off at the resistance $R_1$ is proportional to the current through the load, for example an electric household device. This voltage is converted after amplification and rectification into a pulse sequence by the voltage/pulse sequence converter 6. The frequency of the pulse sequence is proportional to the voltage drop at resistance $R_1$ and thus to the current drawn and power consumed by the electric device. The light emitting diode therefore flashes at a frequency corresponding to the current intake and power consumption of the electric device.

Figure 2:
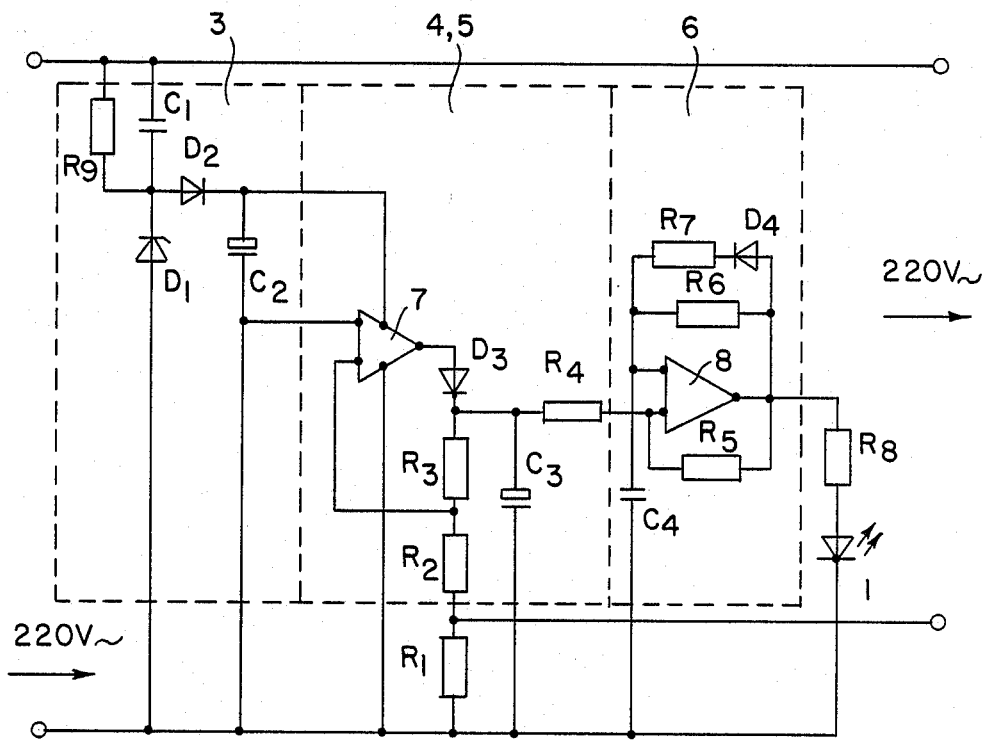
FIG. 2 shows a detailed embodiment of the circuit layout.

FIG. 2 shows a detailed embodiment of the example represented in FIG. 1 of a circuit according to the invention. Parts and elements of the circuit corresponding to those of FIG. 1 carry the same reference symbols.

The network part 3 which supplies the amplifier 7 with a working DC voltage as comprises a capacitor $C_1$ (0.22 u F) acting as a capacitive drop resistance for the circuit operating as a voltage stabilizing rectifier with the diodes $D_1$ (Z 12) and $D_2$ (4148). A resistance $R_9$ connected in parallel with the capacitor $C_1$ (1 M Ohm) prevents current surges that could occur when disconnecting the device from the outlet or as the result of accidental contact of the plug contacts with the residual charge of the capacitor $C_1$. The cathode of the diode $D_2$ is connected to a smoothing capacitor $C_2$ (1000 u F). The combination of the diode $D_2$ and the capacitor $C_2$ performs rectification, so that the part 3 of the network furnishes an operating DC voltage of 12 V. This portion of the circuit is designed in a conventional manner.

A resistance $R_1$ is located in the load circuit, i.e. between the second terminal of the network input and the circuit output. The resistive value is chosen preferably so that the usual current intake of household devices causes a voltage drop in the millivolt range. In the exemplary embodiment the resistance $R_1$ has a value of 0.02 Ohm. This is a sufficiently low resistance value to avoid appreciable affects on the monitored devices.

This voltage is both amplified and rectified in a circuit part 4, 5 which combines the amplifier 4 and the rectifier 5 of FIG. 1. The resistances $R_2$ (6.8 KOhm) and $R_3$ (180 KOhm) are connected in series with the upper terminal of the resistance $R_1$ and the second outlet terminal. The connecting point of $R_2$ and $R_3$ is connected to an amplifier 7 input. The second amplifier input is connected to the second input terminal.

The amplifier 7 output is connected to the anode of a diode $D_3$ (4148). The cathode of diode $D_3$ is connected to the second terminal of resistance $R_3$ and to one terminal of a capacitor $C_3$ (2.2 u F). The other capacitor $C_3$ terminal is connected to the second input terminal.

The diode $D_3$ acting as a rectifier, which in itself would be able to do so from 0.6 V only, performs already in the millivolt range as a result of the preceding amplification of voltage in the amplifier 7. The voltage taken off the resistance $R_1$ is rectified and a proportional DC voltage is provided at the capacitor $C_3$. The amplification factor of the amplifier 7 is set by variation of resistance values $R_2$, $R_3$ and thus of the amplification factor of the amplifier 7 resistances $R_2$ and $R_3$. The flashing frequency variation may be adjusted for a certain variation of voltage across resistance $R_1$ and thus for a certain power intake of the electric device. In the present exemplary embodiment 10 Watts corresponds to approximately a second period 1. The sensitivities may be adjusted differently.

The DC voltage proportional to the voltage across resistance $R_1$ is connected by a resistance $R_4$ (39 KOhm) to the circuit stage 6 for conversion of the DC voltage into a pulse sequence. The input signal for this circuit stage is conducted to a first input of a comparator or difference amplifier 8 serving as a pulse generator. The second input is connected through a capacitor $C_4$ (0.1 u F) to the other network input terminal. The output of the difference amplifier 8 is connected to the first input by a resistance $R_5$ (120 KOhm) and to the second input by a series circuit, comprising a diode $D_4$ (4148) and a resistance $R_7$ (120 KOhm). A resistance $R_6$ (11 MOhm) is connected in parallel with said series circuit. The output signal of the voltage/pulse sequence converter 6 or the difference amplifier 8 is connected through a resistance $R_8$ (1.5 KOhm) to the anode of a light emitting diode 1. The frequency of the output signal is proportional to the voltage applied to the inlet of the voltage/pulse sequence converter and is thus proportional to the voltage taken off the resistance $R_1$. In other words, the flashing frequency of the light emitting diode 1 is proportional to the current taken up by the electric device and the power consumed by it at the instant of observation. The light emitting diode thus flashes at a higher frequency upon an increase in power consumed by the electric device.

The example shown and described represents a particularly advantageous embodiment of the circuit layout according to the invention. However, it is possible for persons skilled in the art to effect modifications and different configurations without exceeding the scope of the invention. The particular elements and values disclosed are exemplary in nature and are not limiting in any way.

We claim:

1. A circuit for continuous display of electrical draw comprising:
    a continuous connection circuit input;
    means for generating voltage pulses exhibiting a frequency below an upper flashing frequency normally resolvable by a human eye for a predetermined anticipated electrical draw range and corresponding to current flow to said circuit input, connected to said circuit input;

means for displaying said frequency as light pulses, connected to said means for generating voltage pulses wherein said means for generating voltage pulses further generates pulses exhibiting a frequency above an upper flashing frequency normally resolvable by a human eye for an electrical draw above said predetermined anticipated electrical draw range.

2. A circuit according to claim 1, wherein said means for displaying is a light emitting diode.

3. A circuit according to claim 1, wherein said means for generating further comprises:

means for producing a signal indicative of current flow connected to said input;

means for rectifying said signal indicative of current flow connected to said means for producing; and means for converting a voltage level to a pulse sequence responsive to said means for rectifying.

4. A circuit according to claim 3, wherein said means for producing a signal comprises a resistive load.

5. A circuit according to claim 4, wherein said resistive load exhibits a low resistance value and said means for rectifying further comprises means for amplifying a voltage drop across said resistive load.

6. A circuit according to claim 5, further comprising an electrical outlet housing for holding said means for displaying and means for generating voltage pulses.

7. A circuit according to claim 4, further comprising an electrical outlet housing for holding said means for displaying and means for generating voltage pulses.

8. A circuit according to claim 3, further comprising an electrical outlet housing for holding said means for displaying and means for generating voltage pulses.

9. A circuit according to claim 2, further comprising an electrical outlet housing for holding said means for displaying and means for generating voltage pulses.

10. A circuit according to claim 1, further comprising an electrical outlet housing for holding said means for displaying and means for generating voltage pulses.

* * * * *